(12) United States Patent
Kim

(10) Patent No.: US 8,303,831 B2
(45) Date of Patent: Nov. 6, 2012

(54) METHODS FOR FABRICATING SEMICONDUCTOR DEVICES

(75) Inventor: Ryoung-han Kim, Clifton Park, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 588 days.

(21) Appl. No.: 12/505,961

(22) Filed: Jul. 20, 2009

(65) Prior Publication Data

US 2011/0014790 A1   Jan. 20, 2011

(51) Int. Cl.
*B44C 1/22*  (2006.01)
*C03C 15/00*  (2006.01)
*C03C 25/68*  (2006.01)
*C23F 1/00*  (2006.01)

(52) U.S. Cl. ............................. 216/41; 216/46

(58) Field of Classification Search .................... 216/41, 216/46
See application file for complete search history.

(56) References Cited

U.S. PATENT DOCUMENTS

2009/0142701 A1 *  6/2009  Hsu et al. ............. 430/296
* cited by examiner

*Primary Examiner* — Roberts Culbert
(74) *Attorney, Agent, or Firm* — Ingrassia Fisher & Lorenz, P.C.

(57) ABSTRACT

Methods are provided for fabricating a semiconductor device on and in a semiconductor substrate. In one embodiment, a method comprises the steps of forming etch masking features overlying the semiconductor substrate, the etch masking features having a first thickness, and forming an etch barrier layer overlying the substrate, the etch barrier layer having a second thickness less than or substantially equal to the first thickness. The method also comprises removing the etch masking features to expose the substrate, and etching the substrate using the etch barrier layer as an etch mask.

19 Claims, 6 Drawing Sheets

METHODS FOR FABRICATING SEMICONDUCTOR DEVICES

FIELD OF THE INVENTION

The present invention generally relates to methods for fabricating semiconductor devices, and more particularly relates to methods for fabricating semiconductor devices using an image reversal lithography technique.

BACKGROUND OF THE INVENTION

There is a continuing trend within the microelectronics industry to incorporate more circuitry having greater complexity on a single integrated circuit (IC) chip. This trend generally entails shrinking the size of individual devices within the circuit by reducing the critical dimensions (CDs) of device features along with the pitch of the device features. Microlithography tooling and processing techniques play an important role in resolving the features necessary to fabricate devices and, accordingly, are continually under development to meet industry milestones relating to the CD and pitch characteristic of each new technology generation.

High numerical aperture (NA) 193 nanometer (nm) optical projection stepper/scanner systems in combination with advanced photoresist (or resist) processes now are capable of routinely resolving isolated and dense line/space resist features having CDs and pitches, respectively, well below the wavelength of the exposing radiation. However, to meet the requirements of device design rules which continue to push the resolution limits of existing processes and tooling, other more specialized techniques have been developed to further enhance resolution. These methods include double patterning techniques (DPT) such as litho/freeze/litho/etch (LFLE) processes in which device patterns having features designed with a potentially unresolvable pitch are decomposed or "split" into two or more complementary, and more easily resolved patterns, each containing features with a relaxed pitch. In LFLE, such pitch splitting is achieved by patterning a first layer of photoresist followed by "freezing" the resist features rendering them unaffected by a second patterning process used for imaging a second layer of photoresist. Other resolution-enhancing techniques include sidewall spacer lithography techniques often used, for example, in the fabrication of FinFET devices. Such processes generate a masking layer having high resolution lines with a narrow pitch that is ultimately used as an etch mask to form fin structures.

Resolution enhancement methods also include image reversal processes whereby an etch mask layer is fabricated having a tonality reverse that of patterned masking features formed by a previous lithography process. Image reversal processes may be useful for patterning inherently difficult-to-resolve features such as contact holes and narrow resist trenches by reversing the tonality of pillar and line features, respectively. This is because opaque pillar and line features from a brightfield (or positive tone) photomask generate a higher contrast aerial image than clear contact hole and space features from an analogous darkfield photomask having the same CD, and thus are inherently more resolvable. However, conventionally a single image reversal process suitable for reversing the tone of both resist line and pillar features and compatible with both LFLE and sidewall spacer lithography processes does not exist.

Accordingly, it is desirable to provide methods for fabricating semiconductor devices using an image reversal lithography technique that is suitable for reversing the tone of both resist line and pillar features and is compatible with both LFLE and sidewall spacer lithography processes. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for fabricating a semiconductor device on and in a semiconductor substrate. In accordance with an exemplary embodiment of the invention, one method comprises the steps of forming etch masking features overlying the semiconductor substrate, the etch masking features having a first thickness, and forming an etch barrier layer overlying the substrate, the etch barrier layer having a second thickness less than or substantially equal to the first thickness. The method also comprises removing the etch masking features to expose the substrate, and etching the substrate using the etch barrier layer as an etch mask.

A method is provided of fabricating a semiconductor device on and in a semiconductor substrate in accordance with another exemplary embodiment of the invention. The method comprises forming a first patterned layer overlying the substrate, the first patterned layer having a first thickness, freezing the first patterned layer, and forming a second patterned layer overlying the substrate, the second patterned layer having a second thickness. The method also comprises forming an etch barrier layer overlying the substrate, the etch barrier layer having a third thickness less than or substantially equal to the smaller of the first thickness and the second thickness, removing the first patterned layer and the second patterned layer, and etching the substrate using the etch barrier layer as an etch mask.

A method is provided of fabricating a semiconductor device on and in a semiconductor substrate in accordance with yet another exemplary embodiment of the invention. The method comprises forming a mandrel overlying the substrate, the mandrel having side surfaces, forming sidewall spacers overlying the side surfaces of the mandrel, the sidewall spacers having a first thickness, and removing the mandrel. The method also comprises forming an etch barrier layer overlying the substrate, the etch barrier layer having a second thickness less than or substantially equal to the first thickness, removing the sidewall spacers to expose the substrate, and etching the substrate using the etch barrier layer as an etch mask.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Manufacturing of modern semiconductor devices requires high resolution lithography processing methods. In accordance with one embodiment, one such method includes fabricating semiconductor devices using an image reversal lithography process that generates an etch mask having the reverse tonality of one or more previously patterned masking layers. This method involves forming masking features overlying a semiconductor substrate followed by application of an etch barrier layer having a thickness that is less than or substantially equal to that of the masking features. The masking features are selectively removed from the etch barrier layer forming an etch mask made from the etch barrier layer having the reverse tonality of the original masking features. Because the etch barrier layer is substantially the same thickness as or is thinner than the masking features, the need for a pre-etch of the etch barrier layer is eliminated thus enabling improved control of CDs and etch barrier layer thickness compared with existing image reversal processes.

Figure 1:
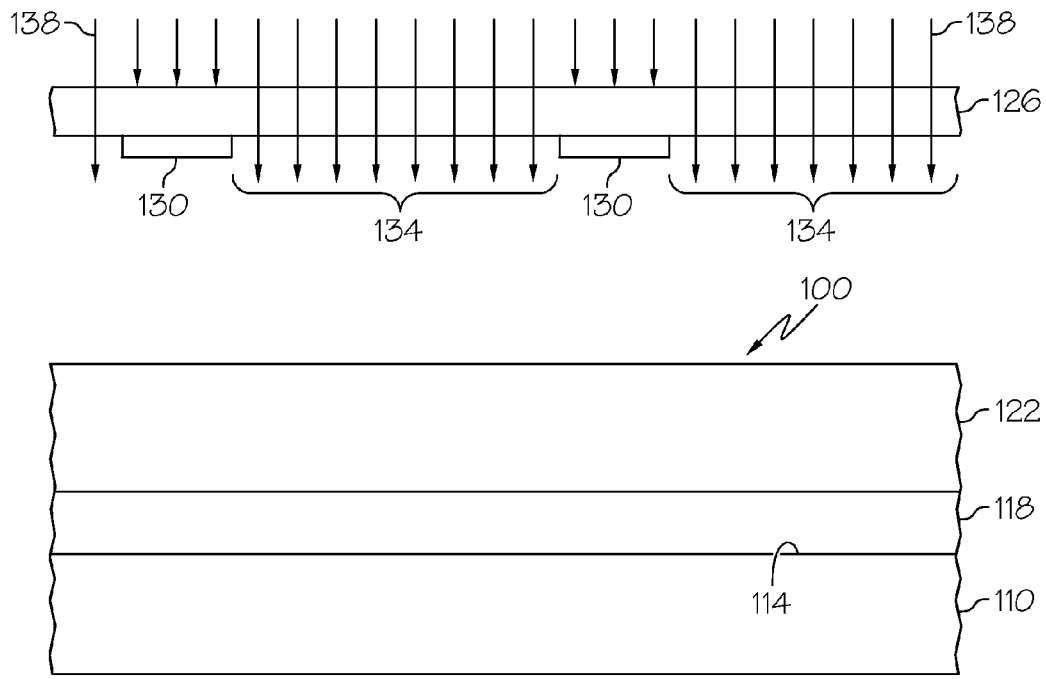
FIGS. 1-3 schematically illustrate, in cross-section, methods for fabricating semiconductor devices using an image reversal lithography process, in accordance with an exemplary embodiment of the present invention.
Figure 2:
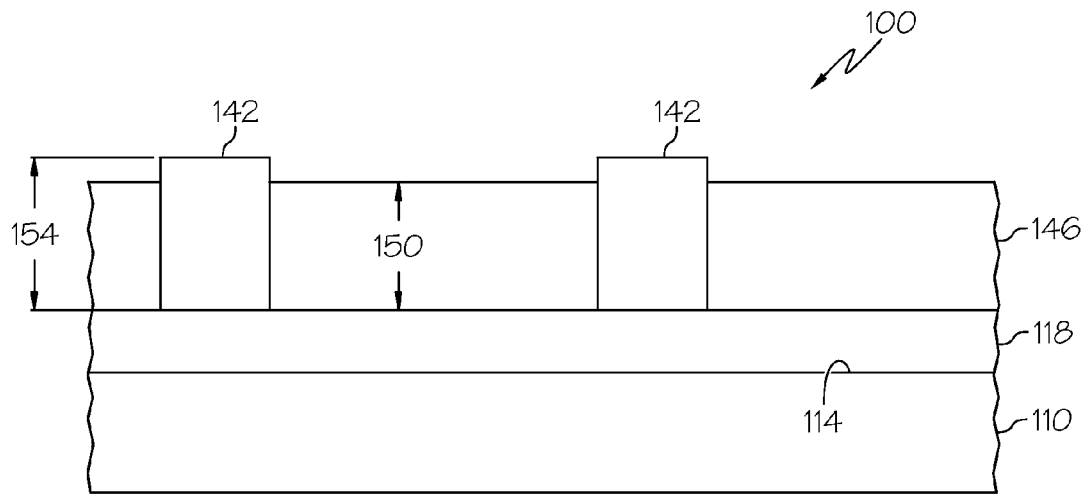
Figure 3:
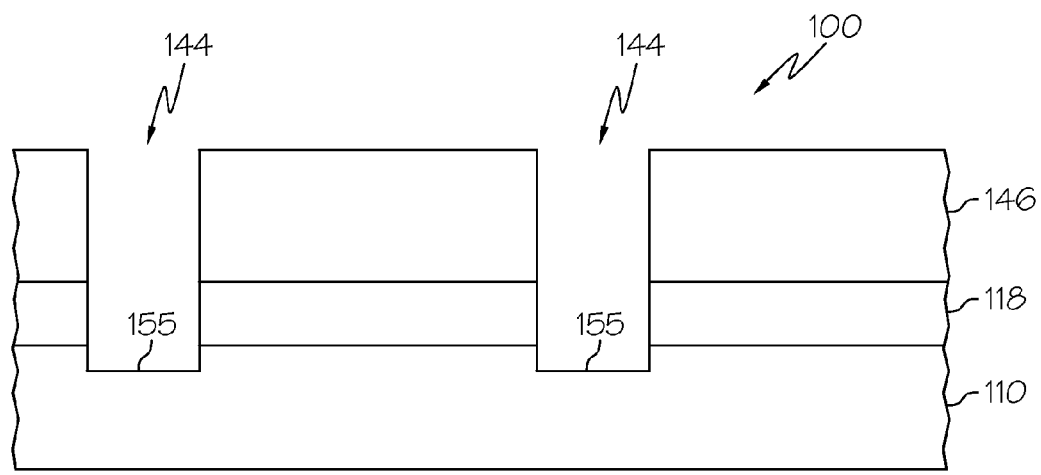

FIGS. 1-3 schematically illustrate, in cross-section, methods for fabricating a semiconductor device 100 including the steps of patterning a substrate 110 in and upon which semiconductor device 100 is fabricated, in accordance with an exemplary embodiment. Referring to FIG. 1, substrate 110 may be any of the types commonly used in the fabrication of semiconductor devices such as silicon, germanium, a III-V material such as gallium arsenide, or another semiconductor material. Substrate 110 may be a bulk wafer or may be of a layered configuration such as, for example, a semiconductor-on-insulator (SOI) configuration comprising a thin layer of monocrystalline semiconductor material on an insulating layer supported by a semiconductor carrier wafer. Alternatively, substrate 110 may include one or more material layers having a surface 114 that overlie a semiconductor material and that is (are) to be etched. These layers may also include any of the materials commonly used in semiconductor device fabrication such as, for example, semiconductor materials, dielectrics, conductive metal layers, and the like. In one embodiment, an organic or inorganic anti-reflective (AR) coating or layer 118 is applied overlying surface 114 as a means of reducing the undesirable effects of reflected radiation and enhancing the resolution and CD control of subsequent photoresist processing. For example, for 193 nm lithography, AR layer 118 may comprise an organic material such as ARC29SR (Brewer Science, Rolla, Mo., USA), or an inorganic material such as SITH 1053 (Shin-Etsu Chemical Co., Tokyo Japan), each applied using a suitable spin coating and post application bake (PAB) process sequence.

A photoresist layer 122 is applied overlying AR layer 118. Layer 122 is most commonly applied using a spin-coating and PAB process sequence. Photoresist layer 122 is an organic photoresist or "resist" layer sensitized to exposure from radiation of a particular wavelength or range of wavelengths. Such exposure radiation wavelengths include, but are not limited to, 365 nanometer (nm), 248 nm, 193 nm, 157 nm, 126 nm, and 13.4 nm. Photoresist layer 122 may be a positive acting or "positive tone" resist formulated to be removed by a developer in regions exposed by actinic radiation, or a negative acting or "negative tone" resist designed to be removed by a developer in unexposed regions.

Next, a photomask 126 containing dark or substantially opaque line features 130 surrounded by substantially transparent or clear features 134 is used in conjunction with a lithography system, such as, for example, a step-and-scan lithography system, configured to project and focus features 130 and 134 onto resist layer 122. Exposing radiation (as represented by arrows 138) passes through clear features 134 exposing photoresist layer 122 in corresponding regions, and is substantially prevented from reaching photoresist layer 122 by opaque line features 130. In this example, layer 122 is chosen to be a positive resist such that opaque line features 130 will be patterned in layer 122 as resist line features. These patterned resist line features will then be transformed into desired trench features using an image reversal process described in detail below. While the present embodiment is described with reference to a particular photomask tonality and resist type, those of skill in the art will appreciate that a photomask of the opposite tonality having analogous clear features may also be used in combination with a negative resist to form such resist line features. However, use of a photomask having opaque line features is preferred because of the improved contrast in the aerial image such a configuration generates, as described above. Further, while this embodiment is described in the context of imaged resist line features, other features imaged into resist layer 122 including, but not limited to, pillar features may also be patterned in the same manner.

Following exposure, layer 122 then is baked for a predetermined time to activate exposed areas of the resist and/or to mitigate standing wave effects. Layer 122 then is immersed in a developing solution used to selectively remove layer 122 in regions exposed by radiation 138 to form masking features 142, as illustrated in FIG. 2. An etch barrier layer 146 then is applied overlying substrate 110. Layer 146 has a thickness (as represented by double-headed arrow 150) that is less than or substantially equal to a thickness (as represented by double headed arrows 154) of masking features 142. Layer 146 is selected so as to be compatible with a subsequent dry etch process, described in greater detail below, such that features 142 etch at a significantly higher rate than layer 146. In one embodiment, layer 146 comprises silicon. In another, preferred embodiment, layer 146 comprises a solvated silicon-comprising material suitable for application via a spin coating and PAB process sequence. Examples of such materials include but are not limited to Shin-Etsu SiTH 1053™ and JSR-Honeywell T32™.

Next, masking features 142 are selectively removed to form trench features 144, as illustrated in FIG. 3. In one embodiment, an oxygen-based ($O_2$) plasma ashing process is used to selectively dry etch features 142. When a silicon-comprising material is used for etch barrier layer 146 and photoresist layer 122 comprises an organic material, such an ashing process may be especially selective because the removal rate of features 142 is substantially higher than that for layer 146. Because features 142 have substantially the same thickness as, or are thicker than layer 146, features 142 are thus exposed to the etching environment and may be removed to form trench features 144 without a preliminary blanket etch of layer 146. Eliminating the need for a blanket etch of layer 146 is efficacious to maintaining CD control and controlling the thickness of the resulting etch mask. This is because precise stoppage of such a blanket etch at a point wherein masking features 142 first emerge via, for example, an endpoint detection technique, is difficult because of the compositional similarities between layers 122 (FIG. 1) and 146, and thus the final, post-etch thickness of layer 146 would be difficult to control. An under-etch of layer 146 could leave masking features 142 submerged in layer 146, and an overetch could reduce the thickness of layer 146, and thus the thickness of the resulting etch mask, more than is needed to expose features 142. Accordingly, improved control of the final thickness of layer 146 and of the CDs of trench features 144 is achieved. The removal of masking features 142 transforms layer 146 into an etch mask having a tonality that is the reverse of masking features 142. AR layer 118 and substrate 110 then are etched using etch barrier layer 146 as an etch mask to form trenches 155 within substrate 110. Layer 146 and AR layer 118 may then be removed.

Figure 4:
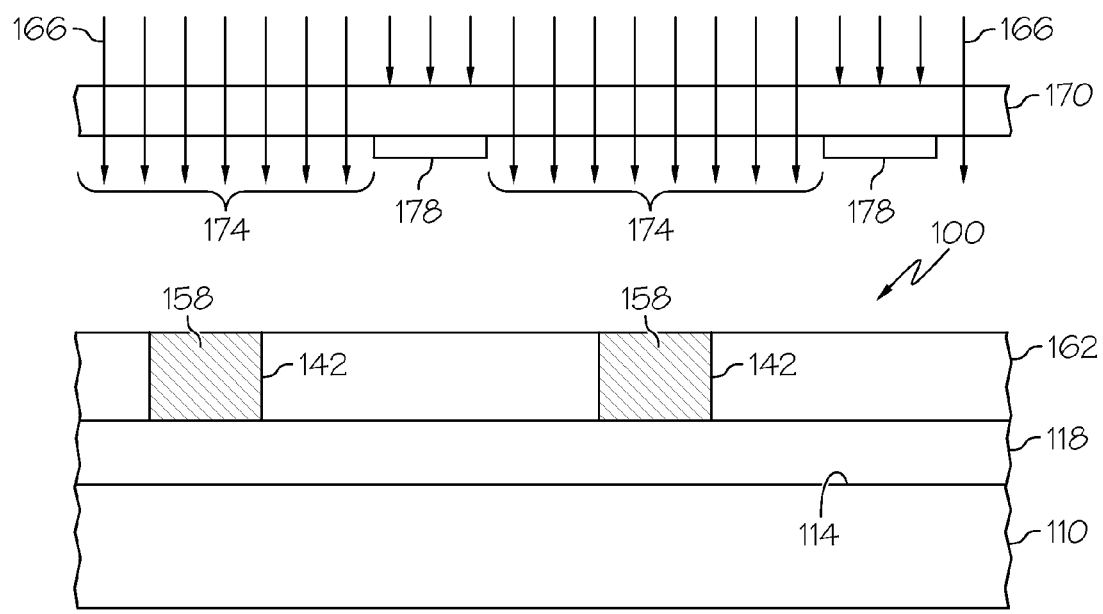
FIGS. 4-6 in conjunction with FIGS. 1-2, schematically illustrate, in cross-section, methods for fabricating semiconductor devices using an image reversal lithography process, in accordance with another exemplary embodiment of the present invention.
Figure 5:
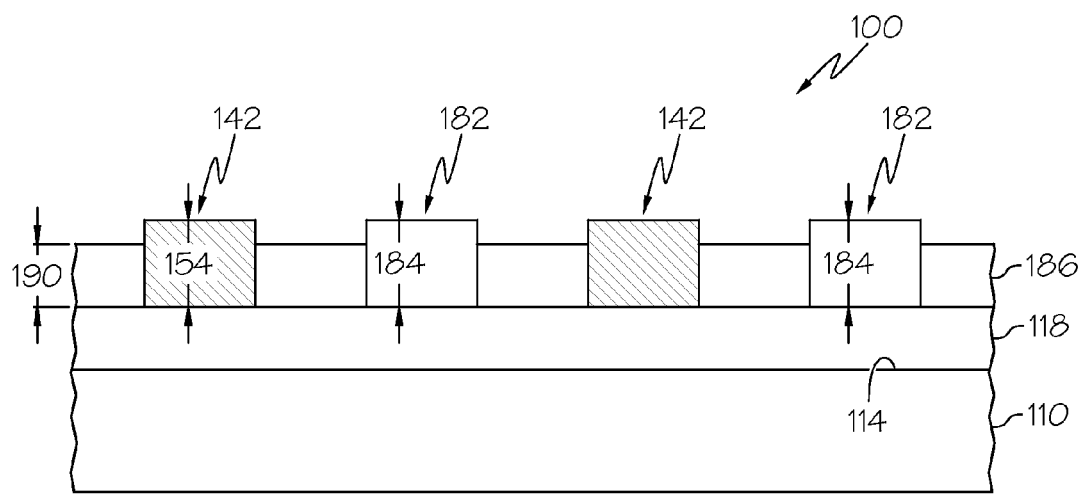
Figure 6:
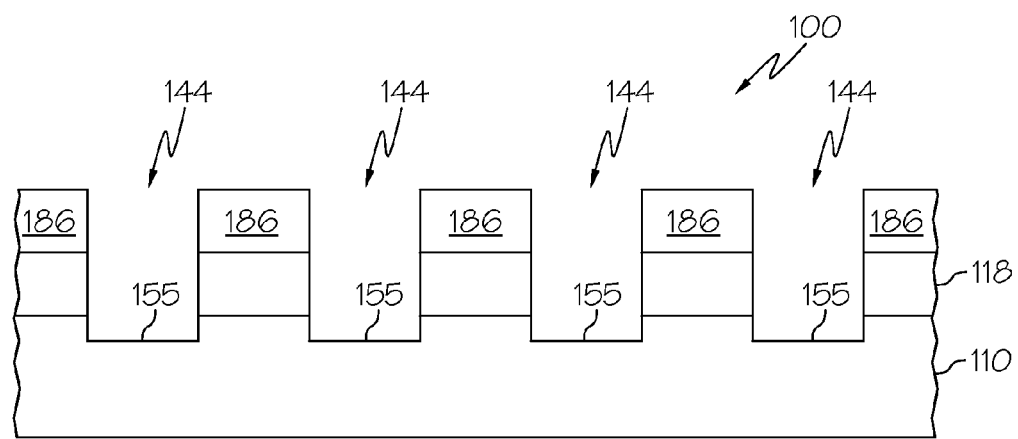

In another exemplary embodiment illustrated in FIGS. 4-6 in conjunction with FIGS. 1-2, a DPT process is performed wherein a second lithography step is included to form additional patterned photoresist masking features complementary to masking features 142. The tonality of the masking pattern formed by the combination of lithography steps then is reversed using an image reversal process. Such a DPT process may be desirable as a means of pitch splitting, or of forming a photoresist mask having features with a narrower pitch than is resolvable using a single lithography step. This method begins with steps that are illustrated in FIGS. 1-2, and previously described. Following their formation, features 142 are stabilized or "frozen" (as illustrated by cross-hatched lines 158), as illustrated in FIG. 4. The term "frozen" as used herein in the context of a photoresist means that the resist layer has been chemically and structurally stabilized for use in conjunction with a subsequent photoresist patterning process. Accordingly, a frozen resist layer substantially maintains pattern fidelity when subjected to the coating, baking, exposure, and development steps associated with the second resist layer. The freezing of features 142 may be performed using a process that includes but is not limited to exposure to heat and/or ultraviolet (UV) radiation, ion bombardment, electron bombardment, and the like, in a manner that cross-links polymers within the resist. Alternatively, freezing may be done through a chemical treatment which stabilizes the resist to the above processes. Next, a photoresist layer 162 is applied as a blanket coating overlying substrate 110. Layer 162 is a positive resist and may be applied as previously described with reference to layer 122, illustrated in FIG. 1. Next, photoresist layer 162 is selectively exposed to radiation (as represented by arrows 166) through a photomask 170 having substantially clear features 174 and substantially opaque features 178. Exposing radiation passes through clear features 174 to expose layer 162, but is blocked from reaching layer 162 by opaque features 178.

Following exposure, layer 162 is subjected to a post-exposure bake, and is developed as previously described with reference to layer 122. Because layer 162 is a positive resist, exposed regions are selectively removed by the developer forming masking features 182, as illustrated in FIG. 5. The thickness of masking features 182 (as represented by double-headed arrows 184) may be greater than, less than, or substantially equal to the thickness 154 of masking features 142, and in one embodiment (as illustrated), features 182 and 142 have substantially the same thickness. Next, an etch barrier layer 186 is applied overlying substrate 110 using a spin coating and PAB sequence. Layer 186 may be selected based upon criteria previously described with respect to etch barrier layer 146, and has a thickness (as represented by double-headed arrows 190) that is less than or substantially equal to the smaller of thickness 154 and thickness 184 of features 142 and features 182, respectively. As previously described, fabricating masking features 142 and 182 with thicknesses greater than or substantially equal to etch barrier layer 186 prevents layer 186 from covering features 142 and 182, thus enabling the removal of these features without the need for a preliminary blanket etch of layer 186.

Masking features 142 and 182 then are selectively removed to form trench features 144, respectively, as illustrated in FIG. 6. The portions of layer 186 that remain comprise an etch mask patterned with the reverse tonality of masking features 142 and 182 in combination. Features 142 and 182 may be removed as previously described with reference to features 142, and illustrated in FIG. 3. Following the removal of masking features 142 and 182, layer 186 may be used as an etch mask to form trenches 155 etched into AR layer 118 and substrate 110. AR layer 118 and layer 186 can then be removed.

Figure 7:
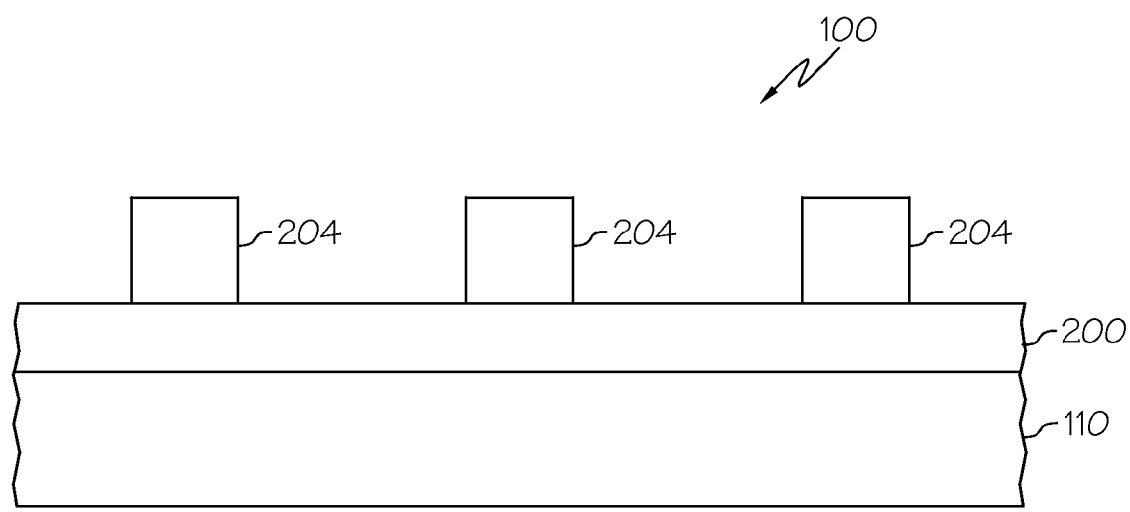
FIGS. 7-11 schematically illustrate, in cross-section, methods for fabricating semiconductor devices using an image reversal lithography process, in accordance with a further exemplary embodiment.

In another exemplary embodiment illustrated in FIGS. 7-11, an image reversal process is applied to features formed by a spacer lithography process. This method begins by providing substrate 110, as illustrated in FIG. 7 and as previously described with reference to FIG. 1. The method continues with the deposition of a mandrel layer and a sidewall spacer layer, to be described in detail below, that are used for the formation, respectively, of sacrificial mandrels and sidewall spacers adjacent the sidewalls of these mandrels. Because ultimately an etch mask will be formed containing a pattern having the reverse tone of these sidewall spacers, material composition for mandrels and spacers preferably is selected such that mandrels can be removed from sidewall spacers with high selectivity. Such high selectivity is desirable so that erosion of the spacer, along with an associated degradation in profile and CD, is avoided.

Referring to FIG. 7, in accordance with one embodiment, a mandrel layer 200 is formed overlying substrate 110. Mandrel layer 200 may comprise a deposited silicon oxide, silicon nitride, silicon oxynitride, polycrystalline silicon, amorphous silicon, amorphous carbon (a-C), a carbon-doped silica (Si-COH), or another material suitable for providing mechanical support for sidewall spacers to be subsequently formed. Mandrel layer 200 may be blanket-deposited using, for example, a PECVD, a low pressure chemical vapor deposition (LPCVD), or a CVD process. In one embodiment, mandrel layer 200 is a photoresist material. Preferably, mandrel layer 200 comprises polycrystalline silicon having a thickness in a range of from about 20 nanometers (nm) to about 1 micron ($\mu$m), and is preferably from about 50 nm to about 1 $\mu$m thick. Because mandrel layer 200 is used as a means of defining the height of subsequently formed sidewall spacers, the choice of thickness for layer 200 will depend upon the desired thickness of a subsequently formed etch barrier layer used to form the reverse tone etch mask. A suitable patterned soft (photoresist) mask 204 then is formed overlying mandrel layer 200 using a conventional lithography process. In one embodiment, soft mask 204 includes an AR layer of the type previously described with reference to AR layer 118, and illustrated in FIG. 1. Such an AR layer is applied overlying layer 200 and used to enhance the resolution of soft mask 204 in a well known manner. In another embodiment wherein mandrel layer 200 is a photoresist, layer 200 may be directly patterned using a conventional lithography process without need of an overlying mask.

Figure 8:
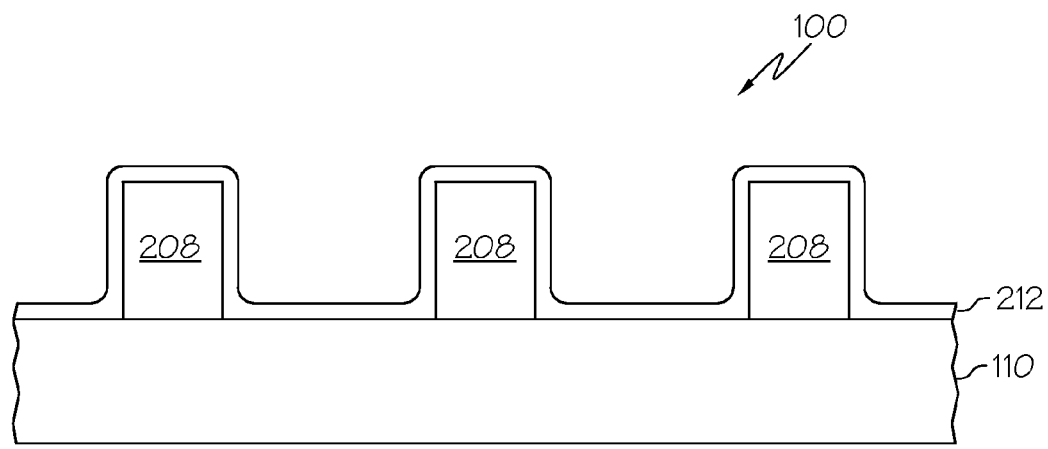

Mandrel layer 200 is anisotropically etched using soft mask 204 as an etch mask to form sacrificial mandrels 208, as illustrated in FIG. 8. Depending on the selectivity of this etch, a hard mask layer (not illustrated) may be interposed between mandrel layer 200 and soft mask 204 and patterned using mask 204 (FIG. 7). The hard mask may then be used alone or in conjunction with mask 204 as a mask for etching of mandrel layer 200. This etch may be performed by, for example, plasma or reactive ion etching (RIE) using chemistries based upon carbon trifluoride/oxygen ($CHF_3/O_2$) to etch silicon nitride, and $CHF_3$ or carbon tetrafluoride ($CF_4$) to etch silicon oxide or oxynitride, ozone ($O_3$), $O_2$, ammonia ($NH_3$) to etch a-C, hydrogen bromide/oxygen ($HBr/O_2$) to etch silicon, or octafluorocyclobutane ($C_4F_8$) and $CF_4$ to etch SiCOH. Any remainder of softmask 204 and/or hard mask (if used) then is removed. Next, a sidewall spacer layer 212 comprising an inorganic material such as, for example, a silicon nitride, a silicon oxynitride, or preferably a silicon oxide, or an organic material such as, for example, a-C is conformally blanket-deposited overlying the surface of device 100 including sacrificial mandrels 208. Sidewall spacer layer 212 may be deposited in a manner described above with reference to mandrel layer 200. In one embodiment wherein mandrels 208 comprise patterned photoresist features, a low-temperature process (below a temperature at which the resist may soften and reflow) is used for deposition of layer 212 so that the pattern fidelity of these photoresist features is not degraded. Preferably, the composition of sidewall spacer layer 212 is chosen such that mandrels 208 may be selectively removed by a subsequent etch process without subjecting layer 212 to further erosion. For example, if mandrels 208 are formed of a silicon nitride, sidewall spacer layer 212 may be formed of a silicon oxide since mandrels 208 may be selectively removed using a heated phosphoric acid/water ($H_3PO_4/H_2O$) solution. If mandrels 208 are formed of an organic material such as, for example, a photoresist or a-C, spacer layer 212 may comprise an inorganic material such as, for example, a silicon oxide, a silicon nitride, or a silicon oxynitride. In this case, mandrels 208 may be selectively removed using an ashing process. Sidewall spacer layer 212 has a thickness of from about 100 nm to about 1 μm and this thickness will depend, at least in part, on the desired CD of reverse tone features the sidewall spacers are used to generate.

Figure 9:
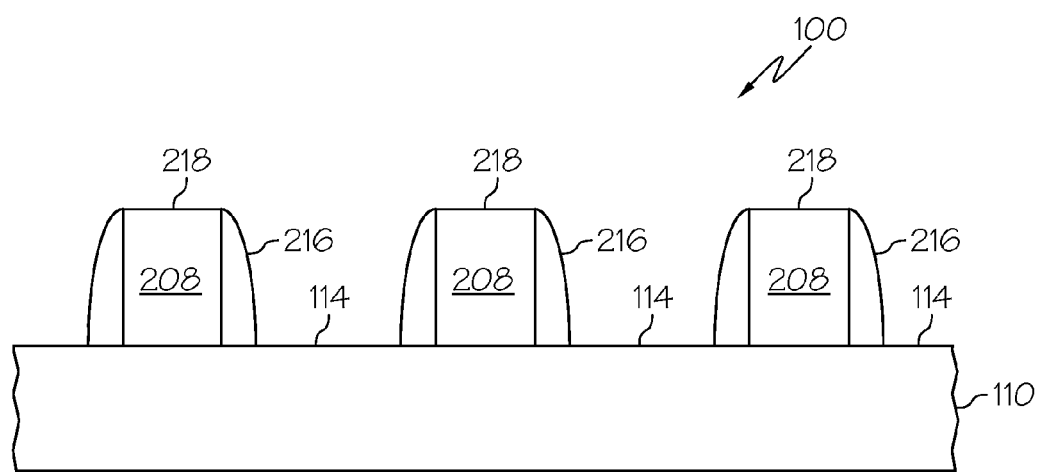

The method continues with an anisotropic etch of sidewall spacer layer 212 to form sidewall spacers 216 adjacent to the sidewalls of sacrificial mandrels 208, as illustrated in FIG. 9. This etch may be performed by, for example, an RIE process using chemistries based upon $CHF_3/O_2$ to etch silicon nitride, and $CHF_3$ or $CF_4$ to etch silicon oxynitride or silicon oxide. This etch removes layer 212 from an upper surface 218 of mandrels 208 and from surface 114 of substrate 110.

Figure 10:
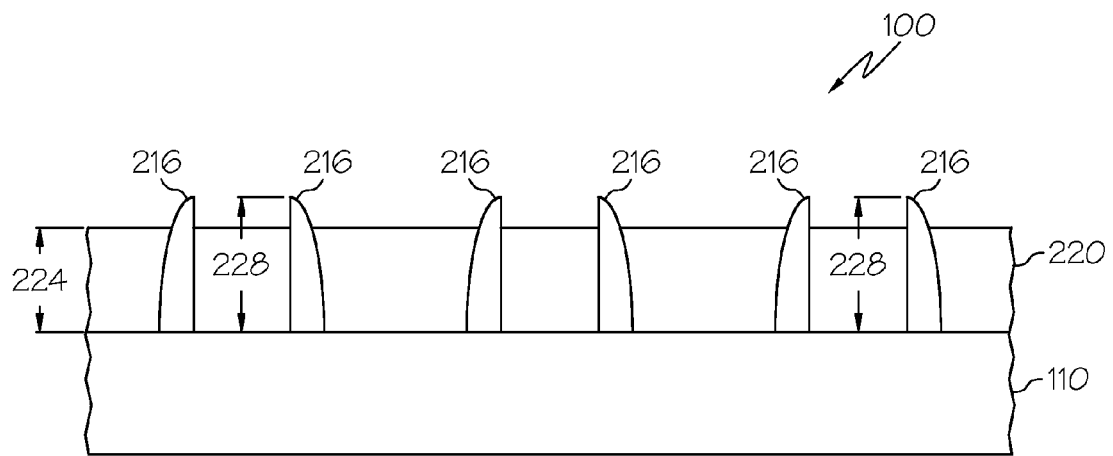

Next, sacrificial mandrels 208 are removed using a suitable wet or dry etch process highly selective to sidewall spacers 216, as illustrated in FIG. 10. Wet etchants used for the removal of mandrels 208 may include dilute HF and heated $H_3PO_4$ solutions with water for etching silicon oxides and silicon nitrides, respectively. If mandrels 208 comprise an organic material such as a-C or a photoresist, a dry plasma ashing process may be used for removal. Next, an etch barrier layer 220 is applied overlying the surface of device 100. Etch barrier layer 220 has a thickness (as represented by double headed arrows 224) that is less than or substantially equal to a thickness (as represented by double headed arrows 228) of sidewall spacers 216, thus leaving spacers 216 uncovered by layer 220 and thereby exposed to a subsequent etching environment. The composition chosen for layer 220 depends on that chosen for spacer layer 212 (FIG. 8) such that spacers 216 may be selectively removed from etch barrier layer 220. For example, if spacer layer 212 is an organic material, layer 220 may be a silicon comprising material such as those described previously with reference to etch barrier layer 146, and illustrated in FIG. 2. If spacer layer 212 is an inorganic material, layer 220 may be an organic material such as a photoresist or another type of planarizing organic material. Examples of such organic planarizing materials include, but are not limited to, Brewer Science WGF300-320™ and JSR HM8006™ and HM8500™.

Figure 11:
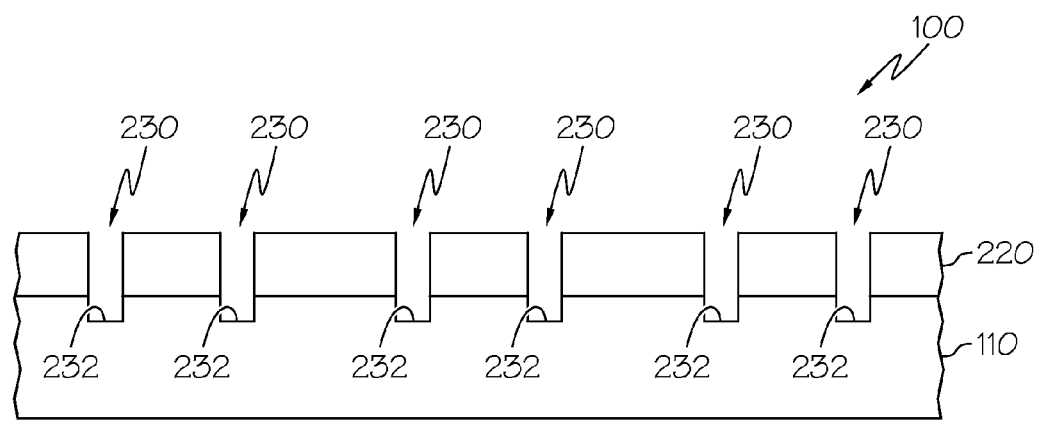

Sidewall spacers 216 then are removed selectively to etch barrier layer 220 to form trench features 230, as illustrated in FIG. 11. The removal process used depends upon the compositions of sidewall spacers 216 and etch barrier layer 220. For example, if sidewall spacers 216 are made of an organic material such as, for example, a-C, and etch barrier layer 220 is a silicon-comprising material, an $O_2$-based ashing process may be used. Conversely, if etch barrier layer 220 is an organic material, and sidewall spacers 216 comprise an inorganic material such as, for example, a silicon oxide or a silicon nitride, then a dry etch process that etches spacers 216 at a substantially faster rate than layer 220 may be used. Alternatively, sidewall spacers 216 may be wet etched using, for example, a hot aqueous $H_3PO_4$ solution if spacers 216 are a silicon nitride, or an aqueous HF-based solution if spacers 216 are a silicon oxide. When spacers 216 are removed, layer 220 may be used as an etch mask having a pattern that is the reverse tone of the pattern formed by spacers 216 of FIG. 10. Accordingly, layer 220 may be used as an etch mask with which to etch substrate 110 to form trench features 232 etched into substrate 110 as previously described. Layer 220 may then be removed.

Accordingly, methods have been provided for fabricating a semiconductor device using an etch mask having a tonality that is reverse from that of previously formed masking features. The masking features may be formed using a single conventional lithography process, an LFLE-type DPT that uses two separate lithography processes, or a sidewall spacer lithography process. Following formation of the masking features, an etch barrier layer having a thickness that is less than or substantially equal to that of the masking features is applied overlying the surface of the device. Leaving the masking features uncovered by the etch barrier layer negates the need for a partial preliminary removal of the etch barrier layer that might otherwise be necessary if the masking features were submerged by the etch barrier layer. Accordingly, certain negative effects of such a partial removal such as, for example, reduced control of etch barrier layer thickness and of masking feature CDs is avoided. Because resist lines and pillars are inherently more resolvable (in positive resist), such masking features may be image reversed to enable the fabrication of an etch mask having trenches and contact holes, respectively, having higher resolution (CD and/or pitch) than can be patterned directly. Accordingly, these methods may be used to further extend the resolution limits of the lithography tool set and photoresist processes with which they are used.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor device on and in a semiconductor substrate comprising the steps of:

forming etch masking features overlying the semiconductor substrate, the etch masking features having a first thickness;

forming an etch barrier layer overlying the substrate, the etch barrier layer having a second thickness less than or substantially equal to the first thickness, wherein the etch barrier layer comprises solvated silicon-comprising material;

removing the etch masking features to expose the substrate; and etching the substrate using the etch barrier layer as an etch mask.

2. The method of claim 1, wherein the step of forming etch masking features comprises:

forming a first masking layer overlying the substrate; and patterning the first masking layer.

3. The method of claim 2, wherein the step of forming etch masking features further comprises:

freezing the first masking layer after the step of patterning the first masking layer;

forming a second patterned layer overlying the substrate, the second patterned layer having a second thickness greater than or less than the first thickness;

forming an etch barrier layer overlying the substrate, the etch barrier layer having a third thickness less than or substantially equal to the smaller of the first thickness and the second thickness.

4. The method of claim 2, wherein the step of forming etch masking features further comprises:

freezing the first masking layer after the step of patterning the first masking layer;

forming a second masking layer overlying the substrate, the second masking layer having a third thickness greater than or substantially equal to the second thickness; and patterning the second masking layer.

5. The method of claim 4, wherein the step of patterning the second masking layer is performed before the step of forming an etch barrier layer.

6. The method of claim 1, wherein the step of forming etch masking features comprises:

forming a mandrel overlying the substrate, the mandrel having side surfaces;

forming a spacer layer overlying the substrate and the mandrel;

anisotropically etching the spacer layer to form sidewall spacers overlying the side surfaces of the mandrel; and removing the mandrel.

7. The method of claim 6, wherein the step of forming a spacer layer comprises forming a spacer layer having a composition selected from a group consisting of silicon oxides, silicon nitrides, amorphous carbon, and silicon oxynitrides.

8. The method of claim 6, wherein the step of forming a spacer layer comprises forming an organic spacer layer.

9. The method of claim 1, wherein the substrate comprises an anti-reflective layer, and wherein the step of etching the substrate comprises etching the anti-reflective layer.

10. The method of claim 1, further comprising the step of removing the etch barrier layer after the step of etching the substrate.

11. A method of fabricating a semiconductor device on and in a semiconductor substrate comprising the steps of:

forming a first patterned layer overlying the substrate, the first patterned layer having a first thickness;

freezing the first patterned layer;

forming a second patterned layer overlying the substrate, the second patterned layer having a second thickness greater than or less than the first thickness;

forming an etch barrier layer overlying the substrate, the etch barrier layer having a third thickness less than or substantially equal to the smaller of the first thickness and the second thickness, wherein the etch barrier layer comprises solvated silicon-comprising material;

removing the first patterned layer and the second patterned layer, and etching the substrate using the etch barrier layer as an etch mask.

12. The method of claim 11, wherein the step of removing the first patterned layer and the second patterned layer comprises ashing the first patterned layer and the second patterned layer.

13. A method of fabricating a semiconductor device on and in a semiconductor substrate comprising the steps of:

forming a mandrel overlying the substrate, the mandrel having side surfaces;

forming sidewall spacers overlying the side surfaces of the mandrel, the sidewall spacers having a first thickness;

removing the mandrel;

forming an etch barrier layer overlying the substrate, the etch barrier layer having a second thickness less than or substantially equal to the first thickness, wherein the etch barrier layer comprises solvated silicon-comprising material;

removing the sidewall spacers to expose the substrate; and etching the substrate using the etch barrier layer as an etch mask.

14. The method of claim 13, wherein the step of forming sidewall spacers comprises forming organic sidewall spacers.

15. The method of claim 14, wherein the step of forming an etch barrier layer comprises forming a silicon-comprising etch barrier layer.

16. The method of claim 14, wherein the step of removing the sidewall spacers comprises ashing the sidewall spacers.

17. The method of claim 13, wherein the step of forming sidewall spacers comprises forming inorganic sidewall spacers.

18. The method of claim 17, wherein the step of forming an etch barrier layer comprises forming an organic etch barrier layer.

19. The method of claim 18, further comprising the step of ashing the etch barrier layer.

* * * * *